United States Patent [19]

Truong

[11] Patent Number: 4,733,108

[45] Date of Patent: Mar. 22, 1988

[54] ON-CHIP BIAS GENERATOR

[75] Inventor: Ho-Dai Truong, Pasadena, Calif.

[73] Assignee: Xerox Corporation, Stamford, Conn.

[21] Appl. No.: 392,915

[22] Filed: Jun. 28, 1982

[51] Int. Cl.[4] .................... H03K 3/01; H03K 3/353; H03K 17/56

[52] U.S. Cl. .................... 307/296 R; 307/304; 307/246

[58] Field of Search .................... 307/304, 246 A, 296 R, 307/247, 296.1, 246.1; 328/127, 151

[56] References Cited

U.S. PATENT DOCUMENTS 3,895,280 7/1975 Peterson .................... 328/127

4,052,673 10/1977 Herzog .................... 331/57

4,443,715 4/1984 Fox .................... 307/270

FOREIGN PATENT DOCUMENTS 1223077 2/1971 United Kingdom .................... 331/57

*Primary Examiner*—Stanley D. Miller

*Assistant Examiner*—B. P. Davis

*Attorney, Agent, or Firm*—Robert E. Cunha

[57] ABSTRACT

An improved on-chip bias generator for producing a negative bias for the substrate of a VLSI FET chip for reducing the body effect and for increasing circuit speed. The improvement comprises active FETs to rectify a ring oscillator square wave output, thereby reducing the voltage losses in the rectifier and increasing the amount of voltage delivered to the substrate.

4 Claims, 6 Drawing Figures

PRIOR ART

ON-CHIP BIAS GENERATOR

This invention is an on-chip bias generator for FET VLSI circuits and, more specifically, is a bias generator for biasing the substrate at a voltage of more than two volts to reduce the body effect, decrease capacitance and increase circuit speed.

In an FET, assuming an N+ source and drain and a P-type substrate biased at zero volts, there is a depletion layer between the FET elements and the substrate which acts as a capacitance to ground. This reduces the slope of any voltage transition waveshape and therefore reduces the speed at which the circuit can switch from one state to the other.

This capacitance can be reduced, and the circuit speed increased, by biasing the substrate at a negative voltage which increases the width of the depletion layer.

One method is to generate a negative voltage external to the chip, the corresponding disadvantage being that the chip must dedicate one input line, pin and pad to this bias voltage. A better solution is to provide a bias generator on the chip. A typical circuit comprises a ring oscillator and a diode rectifier. However, this type of circuit produces a relatively low bias voltage because of the voltage drops across the diodes. A bias generator producing a voltage greater than two volts has typically required more space on the chip. The following is a description of a compact improved bias generator which can produce a negative bias of several volts.

The inventive circuit uses a ring oscillator to produce a five volt square wave from the five volt chip supply, and a push-pull buffer, as in the prior art. However, active FETs are then used to rectify the waveshape, rather than diodes. The loss across an active FET is two tenths of a volt instead of a loss of approximately one volt across each rectifying diode in the prior art circuit. The result is a higher bias voltage from a circuit of about the same size.

DETAILED DESCRIPTION OF THE DRAWINGS

Figure 1:
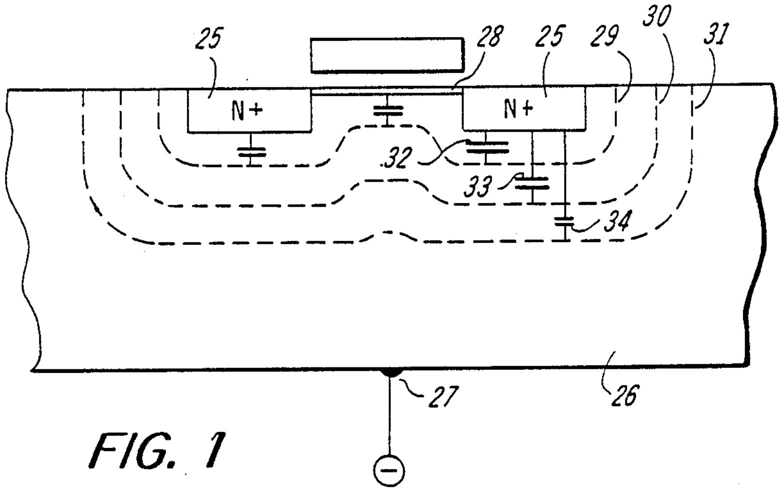
FIG. 1 is a simplified cut-away side view of an FET showing the effect of bias voltage on the width of the depletion layer.

FIG. 1 shows the effect of the substrate bias on the interelectrode capacitance. A typical FET comprises a drain and source 25 connected by a gate 28, all on a substrate 26. To the extent that the substrate is grounded at point 27, there will be a small depletion layer in the substrate immediately surrounding the elements, shown by dotted line 29. Because the depletion layer surrounding source or drain 25 and gate 28 is small, the capacitance, indicated by capacitor 32, is large. Therefore, any signal introduced, at the gate 28 for example, will be delayed by a time proportional to the rise time of a slope determined by the value of this capacitance, before the state of the FET at the source or drain 25 can be switched.

As larger negative voltages are applied at point 27, the depletion layer becomes larger, as indicated by lines 30 and 31, the capacitance decreases, as shown by capacitors 33 and 34, and the circuit speed increases.

Figure 2:
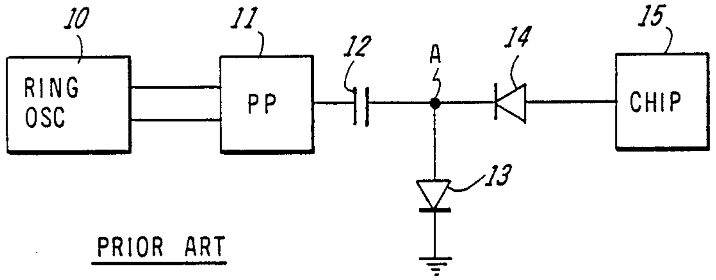
FIG. 2 is an equivalent schematic showing a prior art on-chip bias generator circuit.
Figure 3:
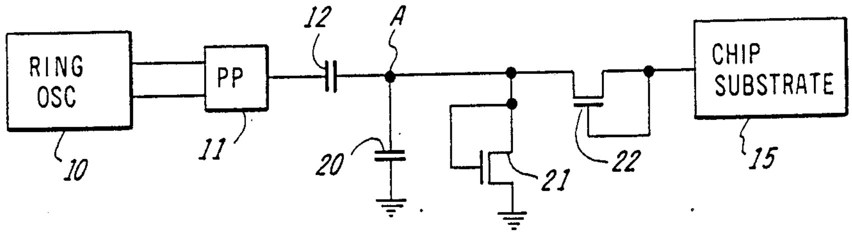
FIG. 3 is a simplified schematic of a prior art on-chip bias generator circuit.

A typical prior art bias generator circuit is shown in FIG. 2 in equivalent form and in FIG. 3 in simplified schematic form. In FIG. 2, a ring oscillator 10 produces a zero to five volt square wave of suitable frequency. This is buffered by a push-pull FET buffer 11 and coupled out through capacitor 12. Diode 13 clamps the voltage at node A to ground, and peak rectifying diode 14 delivers the peak negative voltage to chip substrate 15.

In the simplified circuit of FIG. 2, it is seen that each diode 13, 14 is actually one junction of FET device 21, 22. FET 21 has a voltage drop of approximately one volt, clamping the five volt signal output of the ring oscillator to vary between a theoretical +1 and −4 volts. Also FET 22 drops one volt in series. The remaining voltage is attenuated by various interelectrode capacitances, shown as capacitor 20. The result is a useful bias voltage output to the chip substrate 15 of less than two volts.

Figure 4:
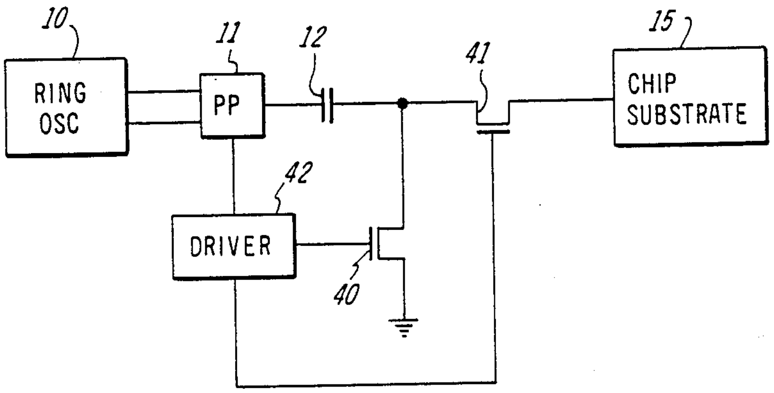
FIG. 4 is a block diagram of the bias generator.

In contrast, FIG. 4 shows the simplified schematic of this invention. The ring oscillator 10 and push-pull buffer 11 produce a square wave which is coupled through capacitor 12. The driver 42 produces control signals which are synchronized to the square wave so that FET 40 conducts during the positive half of the square wave, clamping this positive portion to ground, and so that FET 41 conducts during the negative cycle, producing a large negative voltage at the chip substrate 15.

Because the losses across the FETs 40, 41 are much smaller than the losses across diodes 21, 22 of the FIG. 3 embodiment, the output of the FIG. 4 version is a greater negative voltage.

Figure 5:
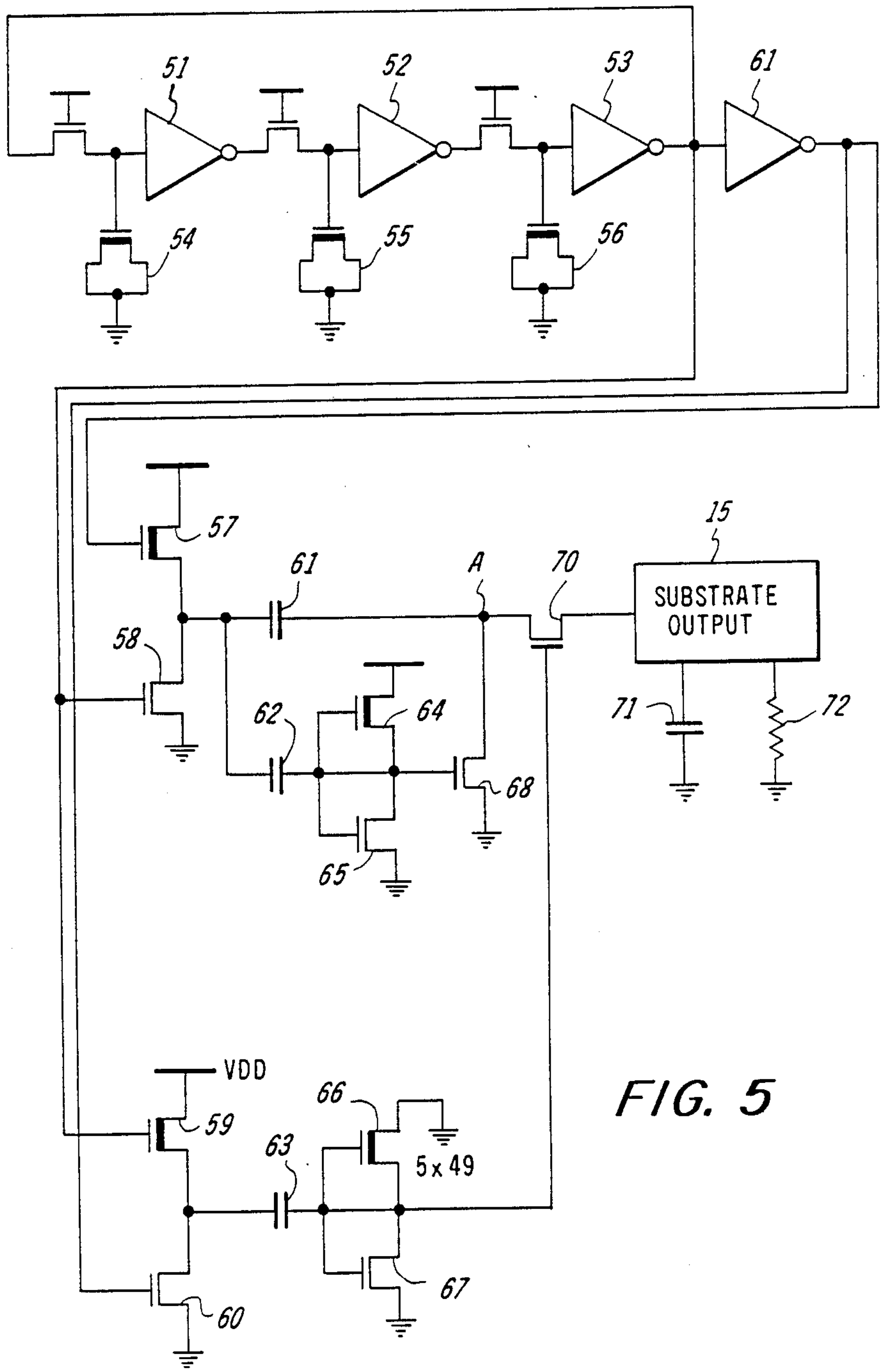
FIG. 5 is a logic schematic of the bias generator.

FIG. 5 is a functional schematic of the circuit. Inverters 51, 52 and 53 are coupled in a loop so that the output of the last inverter 53 will tend to drive the first inverter 51 into a state opposite to the state it is in. The circuit therefore is unstable, and will oscillate at a frequency determined by the value of capacitors 54, 55 and 56.

FETs 57 and 58, along with inverter 61, comprise one push-pull inverter, and FETs 59 and 60, along with the same inverter 61, comprise a second push-pull buffer. The output of the first push-pull inverter is coupled directly through capacitor 61 to node A.

During the positive half cycle of the waveshape at node A, a positive voltage is also coupled through capacitor 62 to the junction betwen FETs 64 and 65, which clamps the voltage to a variation between plus and minus two volts. The plus two volt portion is applied to FET 68, allowing it to conduct. The result is that, for the positive portion of the waveshape at node A, this waveshape is clamped at zero volts, plus the FET voltage drop of approximately 0.2 volts, maximum.

During the negative cycle of the waveshape at node A, a positive voltage is generated at the junction of push-pull FETs 59, 60. This is coupled through capacitor 63, limited to two volts at the junction of FETs 66, 67, and is used to turn on FET 70. This couples the negative voltage at node A into the substrate 15. Various capacitances 71 and resistances 72 internal to the substrate 15 tend to maintain the substrate voltage at a value somewhat less than its peak negative value.

Figure 6:
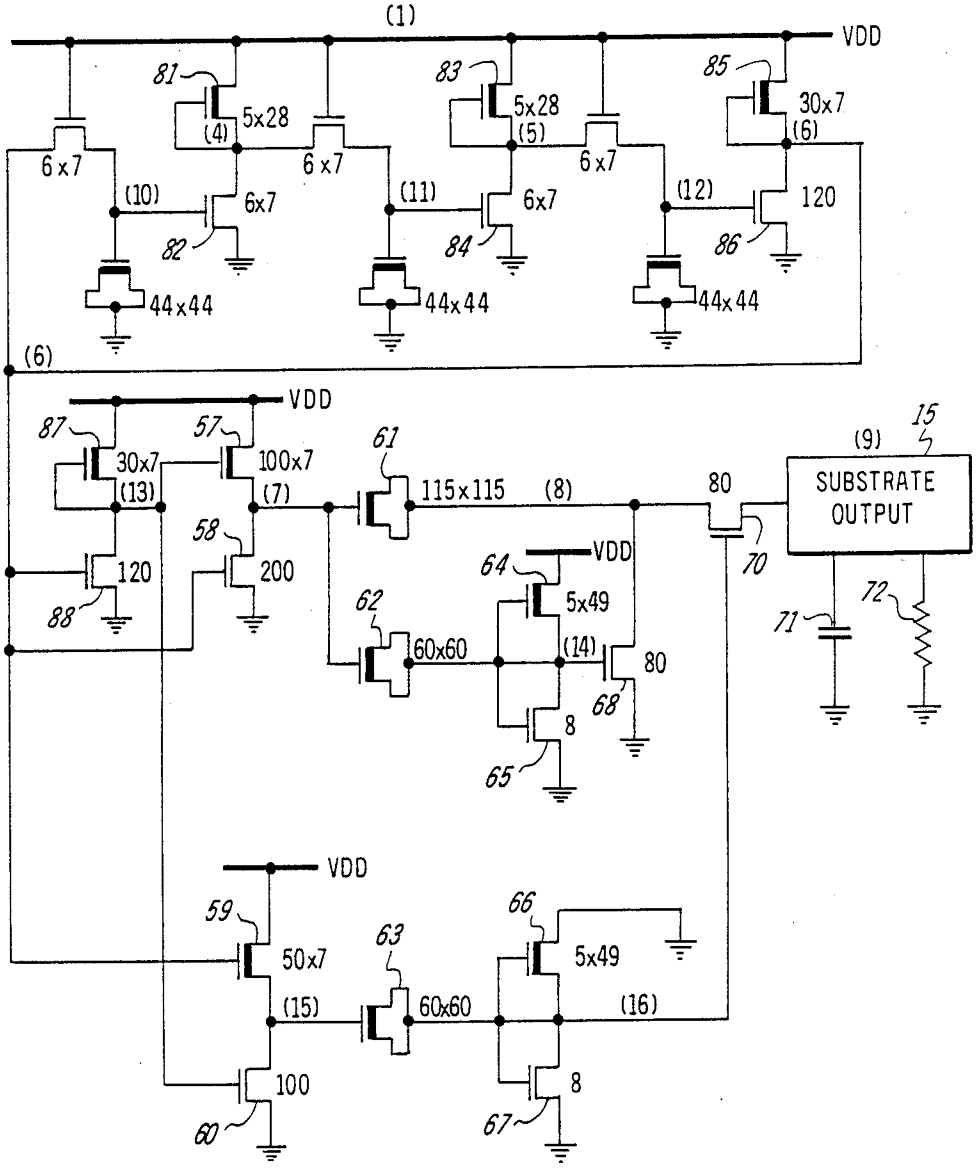
FIG. 6 is a schematic diagram of the bias generator.

The detailed logic schematic corresponding to FIG. 5 is shown as FIG. 6. FETs 81 and 82 in FIG. 6 correspond to the inverter 51 of FIG. 5. Similarly, FETs 83, 84, 85, 86, 87 and 88 of FIG. 6 correspond to inverters 52, 53 an 61 of FIG. 5. The remaining elements of FIG. 6 carry the same numerals as the coresponding elements of FIG. 5, and operate identically.

While the invention has been described with reference to specific embodiments, it will be understood by those skilled in the art that various changes will be made and equivalents may be substituted for elements thereof without departing from the true spirit and scope of the invention. In addition, many modifications may be made without departing from the essential teachings of the invention.

I claim:

1. An on-chip bias generator for providing a bias to the substrate of said chip of the type having oscillator means for producing a series of square waves, rectifying means for producing a negative bias voltage from said square waves, and a capacitor for coupling said square waves from said oscillator means to said rectifying means, an improved rectifying means comprising:

a first FET for coupling the output side of said capacitor to said substrate, a second FET for coupling the output side of said capacitor to ground, and logic means responsive to the output of said oscillator means for allowing said first FET to conduct only when the square wave is at one level and for allowing said second FET to conduct only when the square wave is at the other level.

2. The generator of claim 1 wherein said oscillator means comprises a ring oscillator and a push-pull buffer.

3. An on-chip bias generator for providing a bias to the substrate of said chip comprising:

oscillator means for producing a series of square waves, a capacitor, one side connected to the output of said oscillator means, a first FET for coupling the other side of said capacitor to said substrate, a second FET for coupling the other side of said capacitor to ground, and logic means responsive to the output of said oscillator means for allowing said first FET to conduct only when the square wave is at one level and for allowing said second FET to conduct only when the square wave is at the other level.

4. The generator of claim 2 wherein said oscillator means comprises a ring oscillator and a push-pull buffer.

* * * * *